United States Patent [19]

Otake et al.

[11] 4,074,210
[45] Feb. 14, 1978

[54] DISTRIBUTION TYPE DELAY LINE

[75] Inventors: Hiroshi Otake, Katano; Saburo Koresawa, Hirakata; Kozo Hashimoto, Neyagawa, all of Japan

[73] Assignee: Matsushita Electric Industrial Co., Ltd., Japan

[21] Appl. No.: 711,648

[22] Filed: Aug. 4, 1976

[30] Foreign Application Priority Data

Aug. 20, 1975 Japan .................................. 50-101376
Aug. 20, 1975 Japan .................................. 50-101377
Aug. 20, 1975 Japan .................................. 50-101378
Aug. 20, 1975 Japan .................................. 50-101387

[51] Int. Cl.² ........................ H03H 7/30; H03H 7/34; H01F 5/02; H01F 5/14
[52] U.S. Cl. .................................. 333/29; 333/31 R; 336/69; 336/84 R
[58] Field of Search .............. 333/29, 31 R, 23, 31 C; 336/69, 84, 192, 205, 213, 220, 221, 198

[56] References Cited

U.S. PATENT DOCUMENTS

| 2,703,389 | 3/1955 | Schwartz, Jr. | 333/29 |
| 3,439,293 | 4/1969 | Senf | 333/29 |
| 3,750,054 | 7/1973 | Tamura et al. | 333/29 |

FOREIGN PATENT DOCUMENTS 776,143  6/1957  United Kingdom ................... 333/29

Primary Examiner—Alfred E. Smith
Assistant Examiner—Marvin Nussbaum
Attorney, Agent, or Firm—Burgess, Ryan and Wayne

[57] ABSTRACT

A distribution type delay line particularly adapted for use in a color television receiver and for mass production is disclosed. A bobbin with several axially spaced flanges defining several winding or coil slots therebetween is combined with a circuit of series-connected grounding electrode windings or coils each wound in each slot and each consisting of a predetermined number of turns of insulated wire and/or a circuit of series-connected shield windings each wound in each slot and each consisting of a predetermined number of turns of insulated wire, and a circuit of series-connected signal windings each wound in each slot outwardly and/or inwardly of the grounding electrode and/or shield windings and each consisting of a predetermined number of turns of insulated wire, the grounding electrode and shield windings being wound in the opposite directions so that the magnetic fluxes induced thereacross may be cancelled by each other.

4 Claims, 12 Drawing Figures

DISTRIBUTION TYPE DELAY LINE

BACKGROUND OF THE INVENTION

The present invention relates to a distributed type delay line particularly adapted for use in a television receiver.

In general, a delay line is provided in a video amplifier in a television receiver in order to equalize the time delay for the luminance and chrominance circuits before the signals are combined in the matrix. Of various conventional distributed type delay lines, some typical examples will be described with reference to FIGS. 1 through 5. A delay line shown in FIG. 1 comprises a bobbin with a plurality of axially spaced coaxial flanges 1 defining a plurality of winding slots 2 therebetween, an electrode 4 formed on the surface of the bobbin 3 by applying an electrically conductive material and series-connected windings 5 of insulated wire. The equivalent circuit of the delay line shown in FIG. 1 is shown in FIG. 2. Inductance L is obtained from each winding 5 and capacitance C is induced between the electrode 4 and each winding 5.

The delay line of the type shown in FIGS. 1 and 2 has some defects. Firstly, coating of the electrode 4 is extremely difficult. The better the conductivity of the electrode 4, the greater the eddy current loss becomes. On the other hand, when the electrode 4 with relatively poor conductivity is used, the ground resistance is difficult in each slot 2 and the malconduction through the electrode 4 itself occurs. As a result the delay line characteristics are adversely affected. In addition, it is also extremely difficult to apply the wire with a uniform insulation coating. Therefore, due to the surface flaws such as pin holes and deterioration in insulation the shortcircuit between the electrode 4 and the windings 5 tends to occur. Furthermore, when an electrode forming material is applied on a burr left on the bobbin 3, a cutting-edge shaped projection is formed, breaking the insulation coating on the conductor. These phenomana are more common especially when the delay line is subjected to the temperature change.

Inductance L produced by each winding 5 frequently tends to be affected by the external noise from transistors in a video circuit, a flyback transformer and deflection yokes. Therefore, depending upon the position of the delay line in the color television receiver, shielding means must be provided.

Another example of the prior art delay lines is shown in FIG. 3. It consists of a bobbin 3 with axially spaced coaxial flanges 1 defining a coil slot 2 therebetween, coils 6 of insulated wire 5 and capacitor coils 7' each consisting of a bifilar winding of insulated wires 5 and 7, the coils 6 and 7 being alternately wound on the bobbin 3. FIGS. 4 and 5 show the electric and equivalent circuits, respectively. Each coil 6 induces inductance L while each coil 7' of the bifilar winding, capacitance C.

This delay line has also some defects to be described below. Firstly, the bifilar winding is such that it is difficult to obtain the bifilar windings with uniform quality. Furthermore, one end of each coil 7' must be connected to a ground terminal 8. In practice, each delay line is generally provided with 8 to 15 coils 7' and accordingly 8 to 15 connections to the terminal 8 must be made. Therefore, the delay lines of the type shown in FIG. 3 are not adapted for the mass production.

Moreover, the delay line tends to be adversely affected by the external noise so that shielding means must be provided depending upon the installation position.

A further defect is that each coil 7' has inductance L' which, together with capacitance C, makes up a filter circuit which disadvantageously attenuates the frequency characteristic of the delay line.

SUMMARY OF THE INVENTION

In view of the above, one of the objects of the present invention is to provide a distribution type delay line which is compact in size and inexpensive to fabricate yet very reliable and highly efficient in operation.

Another object of the present invention is to provide a distribution type delay line of the type comprising a bobbin with a plurality of axially spaced flanges defining a plurality of winding or coil slots therebetween and a circuit of series-connected signal windings or coils each consisting of a predetermined number of turns of insulated wire wound in each slot with a circuit of series-connected grounding electrode windings or coils each consisting of a predetermined number of turns of insulated wire wound in each slot inwardly of the signal winding and/or a circuit of series-connected shield windings each consisting of a predetermined number of turns of insulated wire wound in each slot outwardly of the signal winding so that the fabrication steps may be considerably simplified and consequently the mass production may be accomplished with the resultant reduction in fabrication cost.

A further object of the present invention is to provide a distribution type delay line having one or a pair of circuits each consisting of series-connected shield windings to shield external noise so that even when the delay line is positioned adjacent to video transistors, flyback transformers and/or deflection yokes, the noise from these parts may be prevented from being impressed on the series-connected signal windings and adversely affecting the characteristics of the delay line.

A further object of the present invention is to provide a distribution type delay line whose characteristics may be arbitrarily adjusted in a simple manner by selecting the number of turns, size and type of insulated wire of the grounding electrode and shield windings.

A further object of the present invention is to provide a distribution type delay line in which one circuit consisting of series-connected grounding electrode windings and another circuit consisting of series-connected shield windings or a pair of circuits each consisting of series-connected grounding electrode or shield windings are wound in the opposite directions so that the magnetic fluxes induced across the windings may be cancelled by each other and accordingly undesired inductance induced across these windings will not attenuate the frequency characteristic of the delay line.

To the above and other ends, briefly stated, the present invention provides a distribution type delay line characterized by the provision of a bobbin made of an insulated material and provided with a plurality of axially spaced flanges defining winding slots therebetween, series-connected grounding electrode or shield windings each wound in each slot and each consisting of a predetermined number of turns of insulated wire, one end of said series-connected grounding electrode or shield windings being connected to a ground lug or terminal, series-connected signal windings each wound in each slot outwardly or inwardly of said grounding electrode or shield winding and each consisting of a predetermined number of turns of insulated wire, the input and output ends of said series-connected signal windings being connected to input and output terminals, respectively.

BRIEF DESCRIPTION OF THE DRAWINGS

Same reference numerals are used to designate similar parts throughout the figures.

DESCRIPTION OF THE PREFERRED EMBODIMENTS

Figure 1:
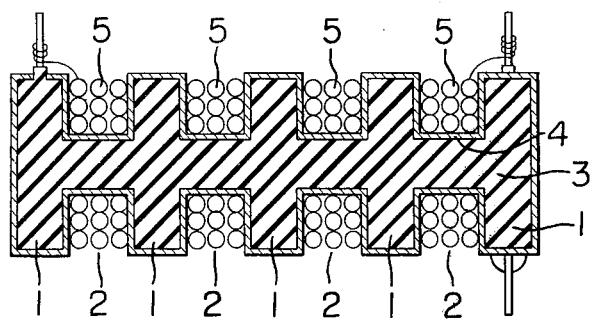
FIG. 1 is a sectional view of one example of the conventional distribution type delay lines.
Figure 2:
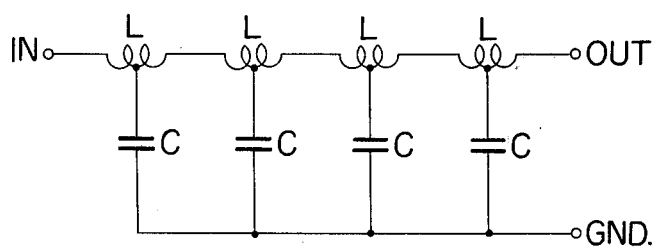
FIG. 2 shows an equivalent circuit thereof.
Figure 3:
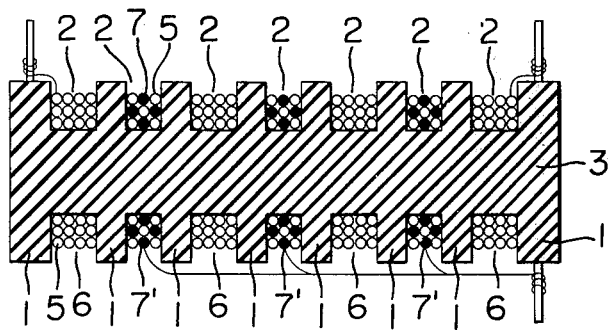
FIG. 3 is a sectional view of another example of the conventional distribution type delay lines.
Figure 4:
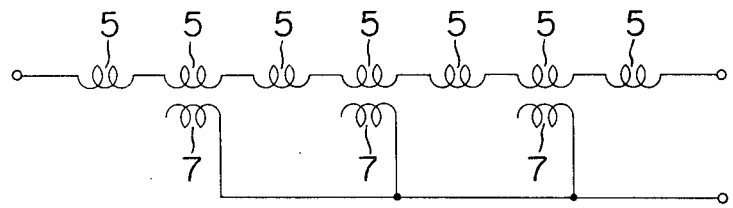
FIG. 4 is a circuit diagram thereof.
Figure 5:
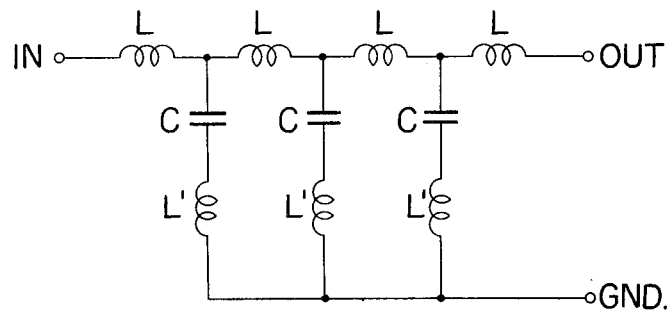
FIG. 5 shows an equivalent circuit thereof.
Figure 6:
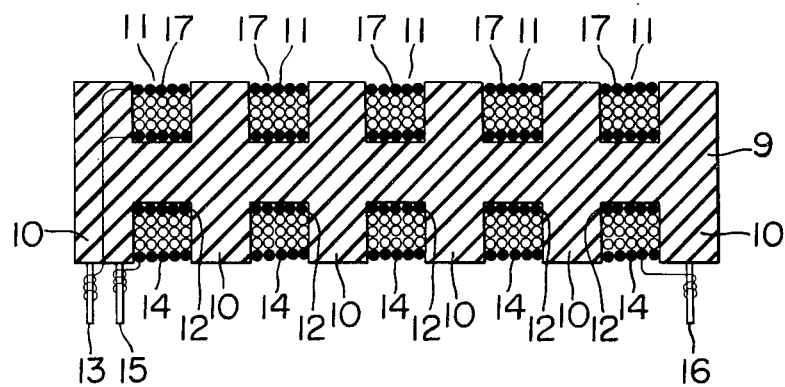
FIG. 6 is a sectional view of a first embodiment of the present invention.
Figure 7:
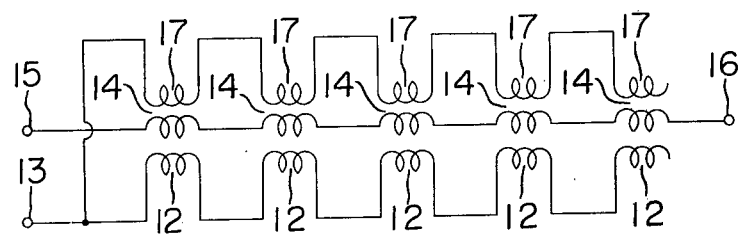
FIG. 7 is a circuit diagram thereof.
Figure 8:
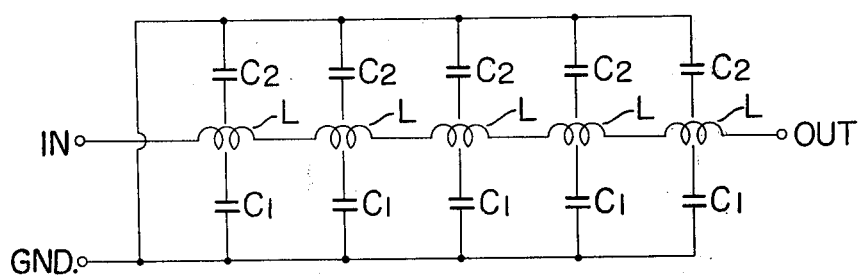
FIG. 8 shows an equivalent circuit thereof.

First Embodiment, FIGS. 6, 7 and 8

Referring first to FIG. 6, a delay line has a bobbin 9 with a plurality of axially spaced, coaxial flanges 10 defining coil slots 11. Grounding electrode windings 12 each consisting of a few turns of insulated wire are placed in the slots 11 and connected in series as shown in FIG. 7. One end of the series-connected windings 12 is connected to a ground lug 13 extended from one of the outermost flanges 10 (See FIG. 7) so that the coils 12 function as grounding electrodes. Wound over each winding 12 in each slot 11 is a signal winding 14 consisting of turns of insulated wire, the number of turns being determined depending upon desired inductance. The input end of the series-connected signal windings 14 is connected to an input terminal 15 extended from said one outermost flange 10 while the output end, to an output terminal 16 extended from the other outermost flange 10. Capacitance $C_1$ is induced between the grounding electrode winding 12 and the signal winding 14 in each slot 11 (See FIG. 8).

Wound over each signal winding 14 is a shield winding 17 consisting of a few turns of insulated wire, and one end of the series-connected shield windings 17 is connected to the ground lug 13. Capacitance $C_2$ is therefore induced between the signal winding 14 and the shield winding 17 (See FIG. 8). It should be noted that the direction of the grounding electrode windings 12 is opposite to that of the shield windings 17 and the number of turns of the shield windings 17 is selected such that the magnetic fluxes induced across the windings 12 and 17 cancel each other.

The circuit diagram and the equivalent circuit are shown in FIGS. 7 and 8, respectively. Each signal winding 14 induces inductance L and capacitance $C_1$ is induced between the grounding electrode winding 12 and the signal winding 14 while capacitance $C_2$, between the signal winding 14 and the shield winding 17. Neither the grounding electrode windings 12 or the shield windings 17 do not induce undesired inductance.

Figure 9:
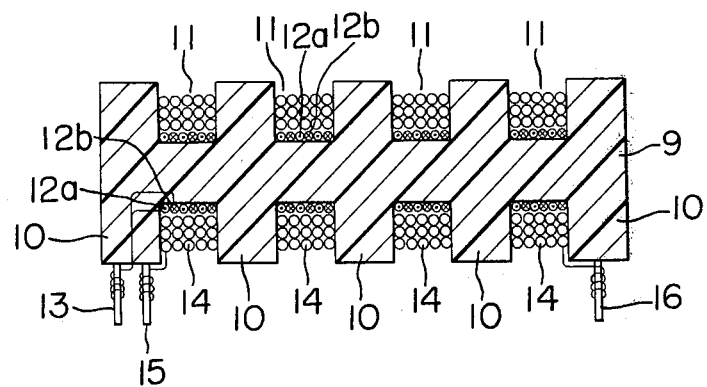
FIG. 9 is a sectional view of a second embodiment of the present invention.
Figure 10:
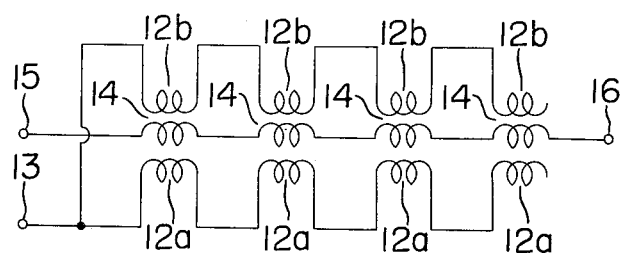
FIG. 10 is a circuit diagram thereof.

Second Embodiment, FIGS. 9 and 10

Even though the first embodiment described above is the best mode of carrying out the present invention, the delay line in accordance with the present invention may take a form of the second embodiment to be described below with reference to FIGS. 9 and 10. According to the second embodiment, a pair of grounding electrode windings 12a and 12b each consisting of a few turns of insulated wire are alternately wound in each slot 11 in the opposite directions so that the magnetic fluxes induced across the windings 12a and 12b may be cancelled by each other. One end of each of the series-connected grounding electrode windings 12a and 12b is connected to the ground lug 13 (See FIG. 10). Wound over each pair of grounding electrode windings 12a and 12b in each slot 11 is a signal winding 14 consisting of turns of insulated wire, the number of turns being determined depending upon desired inductance L, and the input and outputs ends of the series-connected signal windings 14 are connected to the input and output terminals 15 and 16, respectively. Capacitance $C_1$ is induced between the winding 12a and the signal winding 14 while capacitance $C_2$, between the winding 12b and the signal winding 14. The electric circuit diagram of the second embodiment is shown in FIG. 10, and the equivalent circuit is substantially similar to that of the first embodiment shown in FIG. 8.

Figure 11:
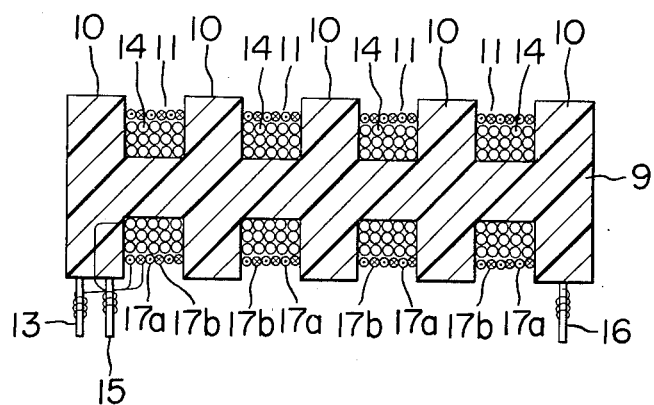
FIG. 11 is a sectional view of a third embodiment of the present invention.
Figure 12:
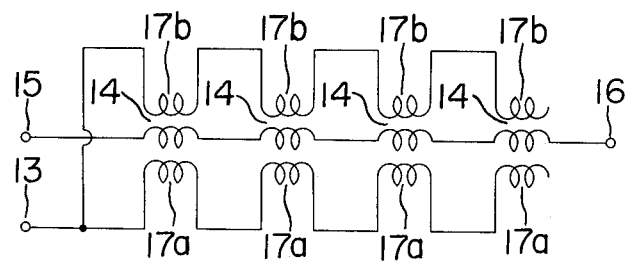
FIG. 12 is a circuit diagram thereof.

Third embodiment, FIGS. 11 and 12

In the third embodiment shown in FIG. 11, the signal winding 14 is first wound in each slot 11 for a number of turns required for inducing desired inductance L, and wound alternately over each signal winding 14 in each slot 11 are a pair of shield windings 17a and 17b each consisting of a few turns of insulated wire. The directions of the windings 17a and 17b are opposite so that the magnetic fluxes inducted thereacross may be cancelled by each other as with the case of the second embodiment. One end of the series-connected shield windings 17a and 17b is connected to the ground lug 13, and the input and output ends of the series-connected signal windings 14 are connected to the input and output terminals 15 and 16, respectively. Capacitance $C_1$ is induced between the shield winding 17a and the signal winding 14 while capacitance $C_2$, between the shield winding 17b and the signal winding 14. The electric circuit diagram of the third embodiment is shown in FIG. 12, and the equivalent circuit is substantially similar to that of the first embodiment shown in FIG. 8.

As described above, the distributed type delay line in accordance with the present invention comprises a first circuit consisting of a plurality of series-connected grounding electrode windings or coils, a second circuit consisting of a plurality of series-connected signal windings or coils and a third circuit consisting of a plurality of series-connected shield windings or coils, or, in the alternative, a circuit comprising a plurality of series-connected signal windings or coils and a pair of circuits each consisting of a plurality of series-connected grounding electrode or shield a plurality of series-connected grounding electrode or shield windings or coils, and each of the series-connected signal, grounding electrode and shield winding or coil circuit is made of one insulated wire. Therefore, the fabrication or winding method may be much simplified so that the mass production may be attained with the resultant reduction in cost. Furthermore, the external noise may be shielded by the series-connected shield windings 17 so that the delay line may be positioned adjacent to the video transistors, flyback transformer or deflection yokes. Noise generated from these circuits is shielded from being impressed upon the signal windings 14 and consequently adversely affecting the desired characteristics of the delay line.

In addition, the characteristics of the delay lines in accordance with the present invention may be arbitrarily selected by selecting the number of turns of each grounding electrode winding 12 and the type and dimensions of insulated wire.

Since each of the signal, grounding electrode and shield windings consists of insulated wire, sufficient insulation can be attained and accordingly there occurs no voltage breakdown. Thus the quality of the delay lines can be much improved.

Each pair of grounding electrode or shield windings are alternately wound in the opposite directions. In like manner, the grounding electrodes and shield windings are wound in the opposite directions so that the magnetic fluxes induced thereacross may by cancelled by each other. Therefore, no undesired inductance is induced between them and consequently the attenuation of the frequency response or characteristic due to the undesired inductance can be prevented. That is, the stable frequency characteristic may be ensured.

What is claimed is:

1. A distributed type delay line comprising
   a bobbin made of insulating material and provided with a plurality of coaxial longitudinally spaced flanges defining a plurality of transverse slots therebetween,
   a signal winding in each slot of said insulated bobbin, said signal windings being series-connected,
   a grounding electrode winding wound between the core of said bobbin and each of said signal windings, and
   a shielding winding wound on each of said signal windings,
   each of said grounding electrode and shielding windings being wound so as to cancel the flux developed by the other winding and only one end of each of said grounding electrode and shielding windings being connected to grounding terminal, to reduce the series inductance between said grounding terminal and said grounding and shielding windings.

2. The delay line according to claim 1, where said grounding and shielding windings are wound in opposite directions.

3. The delay line according to claim 1, wherein said grounding and shielding windings are bifilar, and each bifilar winding is such that the magnetic fluxes induced across said bifilar windings cancel each other.

4. A distribution type delay line as set forth in claim 1 wherein said grounding windings are wound in alternately opposite directions in every two or more slots so as to provide improved flux cancellation and thus to reduce the inductance of said grounding electrode windings.

* * * * *

UNITED STATES PATENT OFFICE
CERTIFICATE OF CORRECTION

Patent No. 4,074,210     Dated February 14, 1978

Inventor(s) Hiroshi Otake, et al

It is certified that error appears in the above-identified patent and that said Letters Patent are hereby corrected as shown below:

Column 1, lines 29 & 30: "difficult" should be --different--.

line 40: "phenomana" should be --phenomena--.

Signed and Sealed this

Eleventh Day of July 1978

[SEAL]

Attest:

RUTH C. MASON  
*Attesting Officer*

DONALD W. BANNER  
*Commissioner of Patents and Trademarks*